United States Patent
Kusuda et al.

(10) Patent No.: US 6,859,616 B2
(45) Date of Patent: Feb. 22, 2005

(54) APPARATUS FOR AND METHOD OF HEAT TREATMENT BY LIGHT IRRADIATION

(75) Inventors: Tatsufumi Kusuda, Horikawa-dori (JP); Tsutomu Ueyama, Horikawa-dori (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/729,460

(22) Filed: Dec. 5, 2003

(65) Prior Publication Data

US 2004/0112890 A1 Jun. 17, 2004

(30) Foreign Application Priority Data

Dec. 5, 2002 (JP) ........................................ 2002-353521
Oct. 8, 2003 (JP) ........................................ 2003-349695

(51) Int. Cl.$^7$ .............................................. F26B 19/00
(52) U.S. Cl. ...................... 392/416; 392/418; 118/724; 118/725; 118/728; 118/729; 219/390; 219/405; 219/411
(58) Field of Search ................................. 219/390, 405, 219/411; 392/416, 418; 118/724, 725, 501, 728, 729

(56) References Cited

U.S. PATENT DOCUMENTS

| | | | |
|---|---|---|---|
| 4,571,486 A | 2/1986 | Arai et al. | .................. 219/354 |
| 4,649,261 A | 3/1987 | Sheets | ........................ 219/390 |
| 4,958,061 A | * 9/1990 | Wakabayashi et al. | ...... 219/411 |
| 5,228,206 A | * 7/1993 | Grant et al. | ................... 34/275 |
| 6,329,304 B1 | * 12/2001 | Kuznetsov et al. | ......... 438/799 |
| 6,399,922 B2 | * 6/2002 | Okase et al. | ................ 219/405 |

FOREIGN PATENT DOCUMENTS

| | | |
|---|---|---|
| JP | 57-162340 | 10/1982 |
| JP | 59-169125 | 9/1984 |
| JP | 60-258928 | 12/1985 |
| JP | 63-166219 | 7/1988 |
| JP | 2001-237195 | 8/2001 |

* cited by examiner

Primary Examiner—Shawntina Fuqua
(74) Attorney, Agent, or Firm—Ostrolenk, Faber, Gerb & Soffen, LLP (57) ABSTRACT

A semiconductor wafer is held by support pins horizontally. A susceptor and a heating plate are moved upwardly so that the semiconductor wafer is transferred from the support pins to the susceptor. At this time, a gas layer is sandwiched between the upper surface of the susceptor and the lower surface of the semiconductor wafer to cause the semiconductor wafer to float over the upper surface of the susceptor for about seventy seconds immediately after the semiconductor wafer is mounted on the upper surface of the susceptor. Then, flash lamps are lit up to perform flash heating while the semiconductor wafer is floating over the upper surface of the susceptor. Even when flashlight irradiation causes rapid thermal expansion of the wafer surface, the semiconductor wafer does not suffer a great stress. This can prevent the semiconductor wafer from breaking.

12 Claims, 7 Drawing Sheets

APPARATUS FOR AND METHOD OF HEAT TREATMENT BY LIGHT IRRADIATION

BACKGROUND OF THE INVENTION

1. Field of the Invention

The present invention relates to a heat treatment apparatus and method of performing heat treatment on a substrate by irradiating a flashlight onto a semiconductor wafer, a glass substrate or the like (hereinafter briefly referred to as a "substrate").

2. Description of the Background Art

In an ion activation step for an ion-implanted semiconductor wafer, a heat treatment apparatus such as a lamp annealing apparatus with a halogen lamp employed therein has conventionally been used. Such a heat treatment apparatus heats (anneals) a semiconductor wafer to temperatures ranging, for example, between about 1000 and 1100° C. thereby achieving ion activation in the semiconductor wafer. In such a heat treatment apparatus, the temperature of a substrate is raised at a speed of about several hundred degrees per second by the use of energy of light emitted from the halogen lamp.

However, it has been found out that, in the case of achieving ion activation in a semiconductor wafer using a heat treatment apparatus which raises the temperature of a substrate at a speed of about several hundred degrees per second, a phenomenon takes place in which the profile of ions implanted into the semiconductor wafer becomes gentle, that is, ions are diffused by heat. When such a phenomenon takes place, implanted ions are diffused even if a high concentration of ions are implanted into the surface of the semiconductor wafer, resulting in a problem in that more ions than required need to be implanted.

To solve the above-described problem, the technique for raising the temperature of only the surface of a semiconductor wafer within an extremely short period of time (several milliseconds or less) by irradiating a flashlight to the surface of the semiconductor wafer by the use of a xenon flash lamp or the like is proposed by, for example, Japanese Patent Application Laid-Open Nos. 59-169125 (1984) and 63-166219 (1988). Since there is not enough time for ions to diffuse in the case of raising the temperature of the wafer surface within an extremely short period of time by a xenon flash lamp, ion activation alone can be achieved without the profile of ions implanted into a semiconductor wafer becoming gentle.

A xenon flash lamp instantaneously irradiates light of extremely high energy to a semiconductor wafer, so that the surface temperature of the semiconductor wafer is raised in an instant. When energy of irradiated light exceeds a threshold value, rapid thermal expansion at the surface may cause the semiconductor wafer to break with a high probability. Therefore, in an actual heat treatment, light of energy having a certain degree of process margin lower than the threshold value is irradiated.

However, when heating a semiconductor wafer being held by a susceptor by irradiating a flashlight from a xenon flash lamp, the semiconductor wafer may break even with a flashlight having energy lower than the above threshold value. This is because, when the semiconductor wafer is going to warp to be convex due to rapid thermal expansion at the surface resulting from instantaneous flashlight irradiation, a great force is applied to a contact part, if any, between an end of the wafer and a pocket edge of the susceptor or positioning pin, whereas there is not sufficient time for the wafer to move sliding over the susceptor in order to relieve such stress. As a result, even when irradiating a flashlight having energy lower than the above-mentioned threshold value, stress generated at a contact part, if any, between an end of the semiconductor wafer and something at the time of instantaneous thermal expansion causes the semiconductor wafer to break.

SUMMARY OF THE INVENTION

The present invention is intended for a heat treatment apparatus for heating a substrate by irradiating a flashlight thereto.

According to the present invention, the heat treatment apparatus comprises: a light source having a flash lamp; a chamber provided under the light source; a susceptor for holding a substrate in a substantially horizontal position in the chamber; a lifting mechanism for lifting up the substrate held by the susceptor from an upper surface of the susceptor; and a lift control element for controlling the lifting mechanism to operate the lifting mechanism before irradiation of a flashlight from the light source to lift up the substrate held by the susceptor as well as to stop the operation of the lifting mechanism at irradiation of a flashlight from the light source to cause a gas layer to be sandwiched between the upper surface of the susceptor and the substrate for bringing the substrate into a floating state.

The substrate in a floating state can freely move at the time of flashlight irradiation. As a result, even when instantaneous flashlight irradiation causes rapid thermal expansion of the substrate surface, the substrate does not suffer a great stress. This can prevent the substrate from breaking at the time of heat treatment.

According to one aspect of the present invention, the heat treatment apparatus comprises: a light source having a flash lamp; a chamber provided under the light source; a susceptor for holding a substrate in a substantially horizontal position in the chamber; support pins insertable into the susceptor and capable of mounting thereon the substrate with top ends thereof extending out of an upper surface of the susceptor; an elevating mechanism for moving the support pins upwardly/downwardly relatively to the susceptor between a position where top ends of the support pins are located under an upper surface of the susceptor and a position where the top ends of the support pins extend out of the upper surface of the susceptor to support the substrate held by the susceptor; and an irradiation control element for controlling the light source to cause the flash lamp to irradiate a flashlight toward the substrate while the substrate is floating with a gas layer sandwiched between the upper surface of the susceptor and the substrate after the elevating mechanism moves the susceptor and the substrate mounted on the support pins upwardly/downwardly relatively to each other to mount the substrate on the upper surface of the susceptor.

The substrate in a floating state can freely move at the time of flashlight irradiation. As a result, even when instantaneous flashlight irradiation causes rapid thermal expansion of the substrate surface, the substrate does not suffer a great stress. This can prevent the substrate from breaking at the time of heat treatment.

The present invention is also intended for a heat treatment method of heating a substrate by irradiating a flashlight thereto.

It is therefore an object of the present invention to provide a heat treatment apparatus and heat treatment method which is capable of preventing a substrate from breaking during heat treatment.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
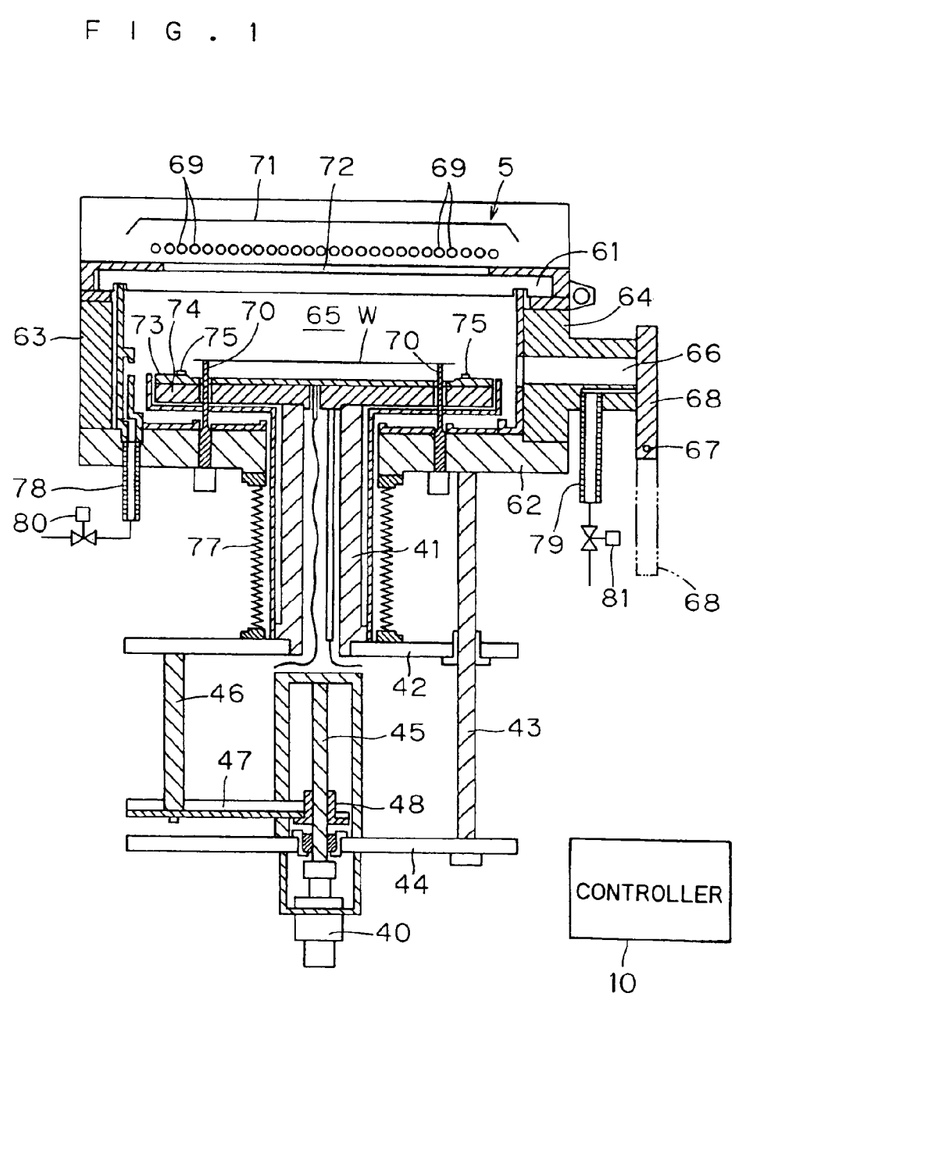
FIGS. 1 and 2 are sectional side elevations each illustrating the structure of a heat treatment apparatus according to a first preferred embodiment of the present invention.
Figure 2:
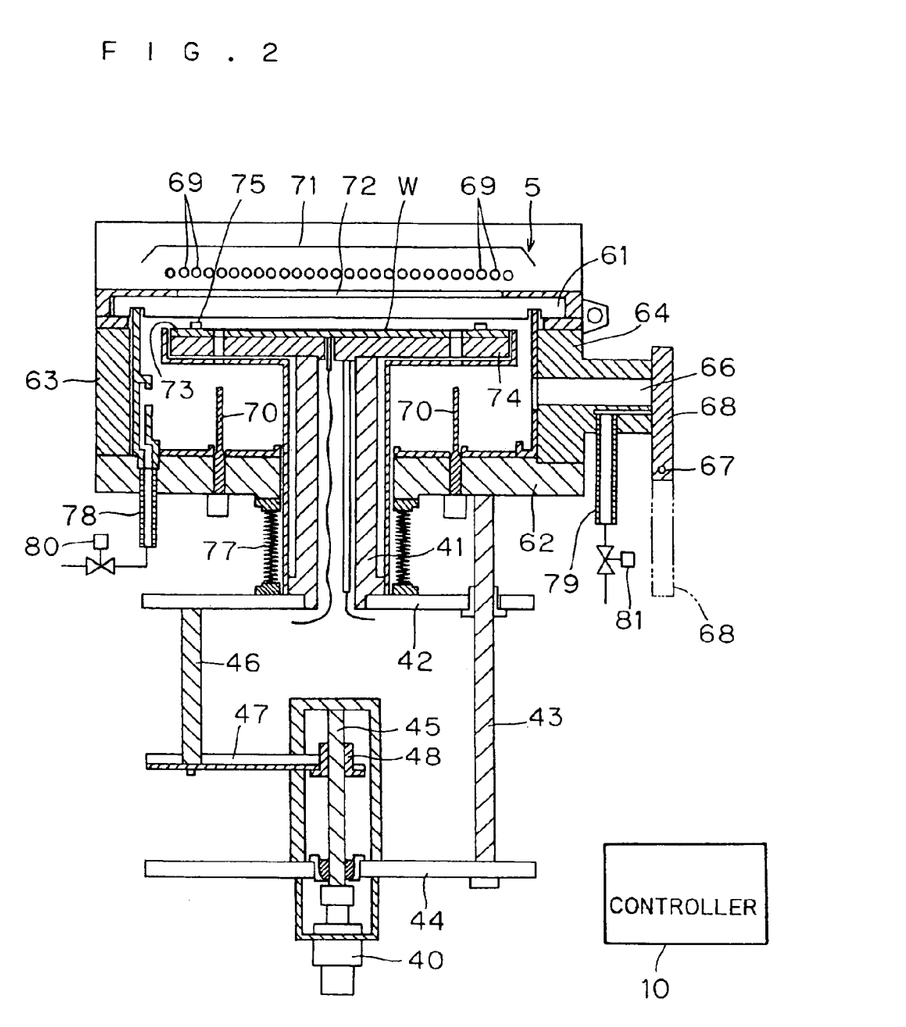

FIGS. 1 and 2 are sectional side elevations each illustrating the structure of a heat treatment apparatus according to a first preferred embodiment of the present invention. This heat treatment apparatus is intended to perform heat treatment on a substrate such as a circular semiconductor wafer by a flashlight emitted from a xenon flash lamp.

The heat treatment apparatus includes a chamber 65 formed by a light transmitting plate 61, a bottom plate 62 and a pair of side plates 63 and 64 and intended for housing a semiconductor wafer W therein and performing heat treatment on the semiconductor wafer W. The light transmitting plate 61 forming the upper portion of the chamber 65 is made of, for example, an infrared transmissive material such as quartz, and functions as a chamber window for transmitting light emitted from a light source 5 to guide it into the chamber 65. The bottom plate 62 of the chamber 65 has support pins 70 provided in a standing manner and extending through a susceptor 73 and a heating plate 74 which will be described later for supporting the semiconductor wafer W from under its lower surface.

The side plate 64 of the chamber 65 has an opening 66 for transporting the substrate W into/out of the chamber 65. The opening 66 is opened and closed by a gate valve 68 rotating about a shaft 67. The semiconductor wafer W is transported into the chamber 65 by a transport robot not shown with the opening 66 being opened. During heat treatment of the semiconductor wafer W in the chamber 65, the opening 66 is closed.

The chamber 65 is provided under the light source 5. The light source 5 includes a plurality of (twenty seven in the present embodiment) xenon flash lamps 69 (hereinafter merely referred to as "flash lamps 69" as well) and a reflector 71. The plurality of flash lamps 69 are rod-like lamps each having a long cylindrical shape, and are arranged in parallel with one another with their longitudinal direction being in line with the horizontal direction. The reflector 71 is provided over the plurality of flash lamps 69 so as to cover all of them.

These xenon flash lamps 69 each have a glass tube containing a xenon gas therein with an anode and a cathode provided on its respective ends and connected to a capacitor, and a trigger electrode wound around the outer periphery of the glass tube. A xenon gas is electrically an insulator, so that no current flows in the glass tube in a normal state. However, in the case where a high voltage is applied to the trigger electrode to produce an electrical breakdown, electricity stored in the capacitor instantaneously flows into the glass tube, and the xenon gas is heated by the Joule heat at that time, whereby light is emitted. Since previously stored electrostatic energy is converted into an extremely short light pulse ranging between 0.1 and 10 milliseconds, the xenon flash lamps 69 are characterized by having the capability of emitting light extremely brighter than in a continuously lit light source.

Provided between the light source 5 and light transmitting plate 61 is a light diffusion plate 72. The light diffusion plate 72 is made of quartz glass as an infrared transmissive material with its surface subjected to light diffusion treatment.

Part of light emitted from the flash lamps 69 directly transmits through the light diffusion plate 72 and light transmitting plate 61 to enter the chamber 65. The remainder of the light emitted from the flash lamps 69 is reflected by the reflector 71 and then transmits through the light diffusion plate 72 and light transmitting plate 61 to enter the chamber 65.

In the chamber 65, the heating plate 74 and susceptor 73 are provided. The susceptor 73 is bonded to the upper surface of the heating plate 74. On the surface of the susceptor 73, displacement preventing pins 75 for the semiconductor wafer W are provided. The semiconductor wafer W is directly held by the susceptor 73 in a substantially horizontal state.

The heating plate 74 is intended to perform preheating (assist heating) on the semiconductor wafer W. The heating plate 74 is made of aluminum nitride and has therein a heater and a sensor for controlling the heater. On the other hand, the susceptor 73 is intended to position and hold the semiconductor wafer W as well as to diffuse heat energy emitted from the heating plate 74 for uniformly preheating the semiconductor wafer W. A material having relatively low thermal conductivity such as aluminum nitride, quartz or the like is employed for the susceptor 73.

The susceptor 73 and heating plate 74 are driven by a motor 40 to move upwardly/downwardly between the transporting position of the semiconductor wafer W shown in FIG. 1 and the heating position of the semiconductor wafer W shown in FIG. 2.

That is, the heating plate 74 is connected to a moving plate 42 through a tube-like member 41. The moving plate 42, guided by a guiding member 43 suspended from the bottom plate 62 of the chamber 65, is movable up and down. Secured to the lower end of the guiding member 43 is a stationary plate 44 provided at its central portion with the motor 40 for rotatably driving a ball screw 45. The ball screw 45 is in threaded engagement with a nut 48 connected to the moving plate 42 through connecting members 46 and 47. Therefore, the susceptor 73 and heating plate 74 are driven by the motor 40 to be movable up and down between the transporting position of the semiconductor wafer W shown in FIG. 1 and the heating position of the semiconductor wafer W shown in FIG. 2.

The transporting position of the semiconductor wafer W shown in FIG. 1 is a position of the susceptor 73 and heating plate 74 after moving downwardly such that the semiconductor wafer W transported into the chamber 65 through the opening 66 by a transport robot not shown is mounted on the support pins 70 or such that the semiconductor wafer W mounted on the support pins 70 is transported out of the chamber 65 through the opening 66. That is, the susceptor 73 and heating plate 74 movable up and down each have through holes, so that the support pins 70 secured to and standing up from the bottom plate 62 are insertable through the susceptor 73 and heating plate 74. As the susceptor 73 and heating plate 74 move downwardly to the transporting position, the top ends of the support pins 70 extend out of the upper surface of the susceptor 73 so as to mount the semiconductor wafer W thereon.

On the other hand, the heating position of the semiconductor wafer W shown in FIG. 2 is a position of the susceptor 73 and heating plate 74 after moving upwardly above the top ends of the support pins 70 in order to perform heat treatment on the semiconductor wafer W. As the susceptor 73 and heating plate 74 move upwardly to the heating position, the top ends of the support pins 70 are positioned under the upper surface of the susceptor 73 as shown in FIG. 2, and the semiconductor wafer W mounted on the support pins 70 is transferred to the susceptor 73. That is, the motor 40 moves the support pins 70 upwardly/downwardly relative to the susceptor 73 between the position where the top ends of the support pins 70 are positioned under the upper surface of the susceptor 73 and the position where the top ends of the support pins 70 extend out of the upper surface of the susceptor 73 to support the semiconductor wafer W held by the susceptor 73.

During the process which the susceptor 73 and heating plate 74 move downwardly from the heating position shown in FIG. 2 to the transporting position shown in FIG. 1, the semiconductor wafer W held by the susceptor 73 is transferred to the support pins 70. That is, the susceptor 73 and heating plate 74 move downwardly from the heating position to the transporting position, so that the semiconductor wafer W held by the susceptor 73 is lifted from the upper surface of the susceptor 73.

Conversely, during the process that the susceptor 73 and heating plate 74 move upwardly from the transporting position shown in FIG. 1 to the heating position shown in FIG. 2, the semiconductor wafer W mounted on the support pins 70 is transferred to the susceptor 73 and is raised with its lower surface supported by the surface of the susceptor 73 to be held horizontally in a position adjacent to the light transmitting plate 61 in the chamber 65. At this time, after the semiconductor wafer W is transferred from the support pins 70 to the susceptor 73, an air layer is inserted between the upper surface of the susceptor 73 and the lower surface of the semiconductor wafer W while a short time, causing the semiconductor wafer W to float over the upper surface of the susceptor 73. Such a floating state continues until air completely flows out from between the upper surface of the susceptor 73 and the lower surface of the semiconductor wafer W to bring them into contact with each other, and usually has a time duration of about seventy seconds, though depending on the diameter of the semiconductor wafer W and the surface properties of the susceptor 73. That is, raising the susceptor 73 and heating plate 74 from the transporting position to the heating position can bring the semiconductor wafer W into a floating state over the susceptor 73 for about seventy seconds.

In the state where the susceptor 73 and heating plate 74 for supporting the semiconductor wafer W move upwardly to the heating position, the light transmitting plate 61 is located between the light source 5 and the semiconductor wafer W held by the susceptor 73 and heating plate 74. The distance between the susceptor 73 and light source 5 at this time can be adjusted to an arbitrary value by controlling the amount of rotation of the motor 40.

Extensible bellows 77 for maintaining the chamber 65 airtight are provided between the bottom plate 62 of the chamber 65 and the moving plate 42 so as to surround the periphery of the tube-like member 41. When the susceptor 73 and heating plate 74 move upwardly to the heating position, the bellows 77 shrink, and when the susceptor 73 and heating plate 74 move downwardly to the transporting position, the bellows 77 extend so as to cut off the atmosphere within the chamber 65 from the external atmosphere.

An inlet pipe 78 communicating with an open/close valve 80 is provided on the side plate 63 opposite to the opening 66 of the chamber 65. This inlet pipe 78 is intended to introduce gas necessary for treatment, e.g., inert nitrogen gas into the chamber 65. On the other hand, the opening 66 in the side plate 64 is provided with an exhaust pipe 79 communicating with an open/close valve 81. This exhaust pipe 79 is intended to exhaust gas within the chamber 65, and is connected to exhaust means not shown through the open/close valve 81.

Figure 3:
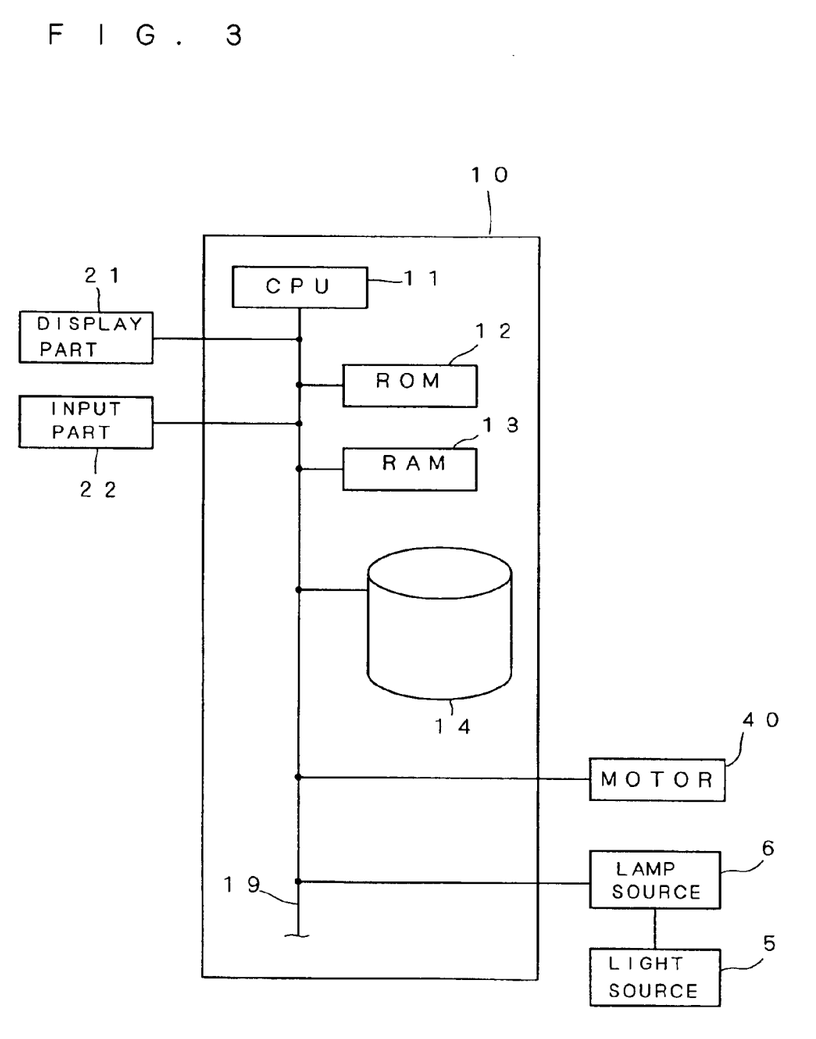
FIG. 3 is a block diagram illustrating the configuration of a controller for the heat treatment apparatus shown in FIG. 1.

Further, the heat treatment apparatus includes a controller 10 for controlling the respective mechanisms including the motor 40. FIG. 3 is a block diagram illustrating the configuration of the controller 10. The configuration of the controller 10 as hardware is similar to a common computer. That is, the controller 10 has a CPU 11 for carrying out various arithmetic operations, a ROM 12 which is a read-only memory for storing a basic program, a RAM 13 which is a read/write memory for storing various types of information and a magnetic disc 14 for storing control software, data and the like, all of which are connected to a bus line 19.

Further, a lamp source (power supply circuit) 6 for light source 5 and the motor 40 of the heat treatment apparatus is electrically connected to the bus line 19. The CPU 11 of the controller 10 executes the control software stored in the magnetic disc 14, thereby controlling the timing when the flash lamps 69 are lit up as well as controlling the motor 40 to adjust the position of the susceptor 73 and heating plate 74.

A display part 21 and an input part 22 are also electrically connected to the bus line 19. The display part 21 is formed by, for example, a liquid crystal display, and displays various types of information such as processing results and recipe contents. The input part 22 is formed by, for example, a keyboard or mouse, and receives inputs such as commands or parameters. An operator of the apparatus can input commands or parameters through the input part 22 while checking the display on the display part 21. The display part 21 and input part 22 may be integrated to constitute a touch panel.

Figure 4:
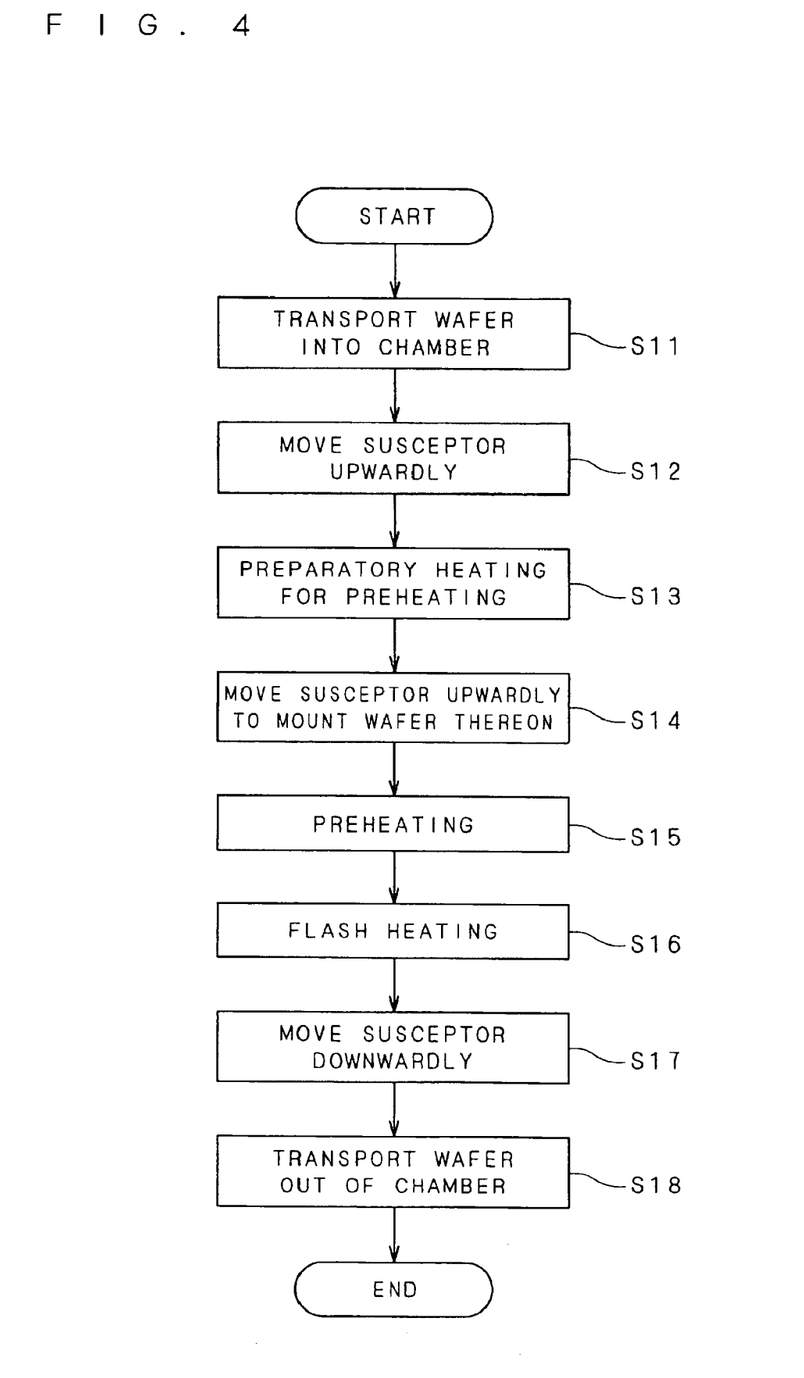
FIG. 4 is a flow chart illustrating the procedure of heat treatment performed by the heat treatment apparatus shown in FIG. 1.
Figure 5:
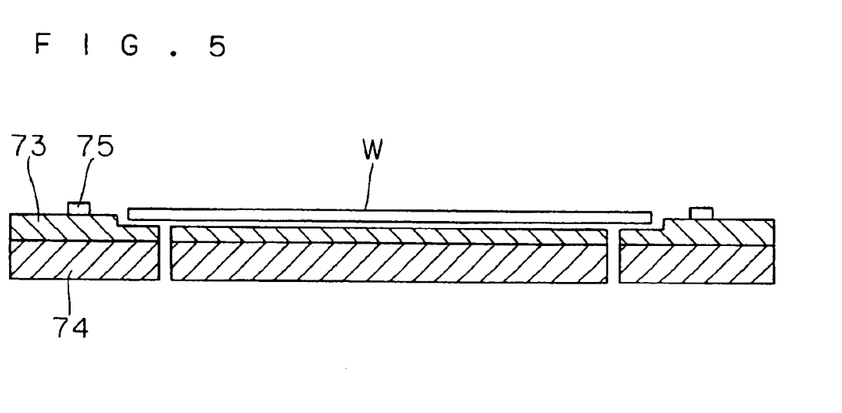
FIG. 5 illustrates the state in which a semiconductor wafer is floating over a susceptor.

Next, a heat treatment operation performed on the semiconductor wafer W by the heat treatment apparatus of the present invention will be described. FIG. 4 is a flow chart illustrating the procedure of heat treatment performed by the heat treatment apparatus according to the first preferred embodiment of the present invention. The semiconductor wafer W to be treated in the heat treatment apparatus is an ion-implanted semiconductor wafer. The respective mechanisms including the motor 40 and lamp source 6 are driven in accordance with instructions given by the controller 10, so that the following processing is carried out.

In the heat treatment apparatus, the semiconductor wafer W is transported into the chamber 65 by a transport robot not shown through the opening 66 and is mounted on the support pins 70 while the susceptor 73 and heating plate 74 are located at the transporting position of the semiconductor wafer W shown in FIG. 1 (step S11). The semiconductor wafer W is thereby held horizontally over the susceptor 73 by the support pins 70. Upon completion of transport of the semiconductor wafer W, the opening 66 is closed by the gate valve 68, and the open/close valves 80 and 81 are opened to produce a current of nitrogen gas in the chamber 65.

Thereafter, the susceptor 73 and heating plate 74 are driven by the motor 40 to move upwardly and temporarily stop just before the susceptor 73 comes into contact with the semiconductor wafer W mounted on the support pins 70 (step S12). The susceptor 73 and heating plate 74 are previously heated to a predetermined temperature by the action of a heater incorporated in the heating plate 74. Therefore, the semiconductor wafer W mounted on the support pins 70 is gradually heated by the susceptor 73 in the state where the susceptor 73 is located slightly under the semiconductor wafer W (step S13). This heating step is a preparatory heating step for a preheating step which will be described later, and is executed for about a second.

Subsequently, the susceptor 73 and heating plate 74 are driven by the motor 40 to further move upwardly to the heating position of the semiconductor wafer W shown in FIG. 2. During this step, the semiconductor wafer W mounted on the support pins 70 is transferred to the susceptor 73, and is mounted horizontally on the upper surface of the susceptor 73 (step S14). At this time, as described above, a gas layer is sandwiched between the upper surface of the susceptor 73 and the lower surface of the semiconductor wafer W, causing the semiconductor wafer W to float over the upper surface of the susceptor 73 during about seventy seconds just after the semiconductor wafer W is transferred from the support pins 70 to the susceptor 73.

In the state where the susceptor 73 and heating plate 74 are located at the heating position of the semiconductor wafer W, the semiconductor wafer W is in close proximity to the susceptor 73 being heated while floating over the susceptor 73, and is thus preheated, so that the temperature of the semiconductor wafer W is raised progressively (step S15).

In this state, the semiconductor wafer W is continuously heated by the susceptor 73. During the temperature rise of the semiconductor wafer W, a temperature sensor not shown monitors the surface temperature of the semiconductor wafer W. It requires about sixty seconds until the surface temperature of the semiconductor wafer W reaches a preheated temperature T1 and becomes stable after the semiconductor wafer W is mounted on the upper surface of the susceptor 73. The preheated temperature T1 ranges from, for example, about 200 to 600° C. Heating the semiconductor wafer W to the preheated temperature T1 of such degree will not cause diffusion of ions implanted into the semiconductor wafer W.

After a while, when the surface temperature of the semiconductor wafer W reaches the preheated temperature T1 after a lapse of sixty seconds after the semiconductor wafer W is mounted on the upper surface of the susceptor 73, the processing progresses to step S16, in which the controller 10 controls the lamp source 6 to light up the flash lamps 69 for performing flash heating. In the present embodiment, the controller 10 controls the lamp source 6 so as to perform flash heating after a lapse of sixty-one seconds after the semiconductor wafer W is mounted on the upper surface of the susceptor 73.

On the other hand, as described above, the semiconductor wafer W is floating over the upper surface of the susceptor 73 for about seventy seconds after the semiconductor wafer W is mounted on the upper surface of the susceptor 73. Therefore, the flash lamps 69 irradiate a flashlight toward the semiconductor wafer W while the semiconductor wafer W is floating with a gas layer sandwiched between the upper surface of the susceptor 73 and the lower surface of the semiconductor wafer W.

A period of time during which the flash lamps 69 are lit up in the flash heating step ranges between about 0.1 and 10 milliseconds. The flash lamps 69 irradiate an extremely strong flashlight since previously stored electrostatic energy is converted into such an extremely short light pulse.

With such flash heating, the surface temperature of the semiconductor wafer W instantaneously reaches a temperature T2. This temperature T2 ranges between about 1000 and 1100° C. which is necessary for ion activation in the semiconductor wafer W. Rising the surface temperature of the semiconductor wafer W to such temperature T2 enables activation of ions implanted into the semiconductor wafer W.

At this time, the surface temperature of the semiconductor wafer W is raised to the temperature T2 within an extremely short period of time ranging between about 0.1 and 10 milliseconds, so that ion activation in the semiconductor wafer W is completed in a short while. This prevents diffusion of ions implanted into the semiconductor wafer W, which can avoid the occurrence of the phenomenon in which the profile of ions implanted into the semiconductor wafer W becomes gentle. Since a period of time required for ion activation is extremely shorter than that required for ion diffusion, ion activation is completed even in a short period of time ranging between about 0.1 and 10 milliseconds that does not cause diffusion of ions.

Further, since the surface of the semiconductor wafer W is heated to the preheated temperature T1 ranging from about 200 to 600° C. using the heating plate 74 before the flash lamps 69 are lit up to heat the semiconductor wafer W, the surface temperature of the semiconductor wafer W can be rapidly raised to the temperature T2 ranging between about 1000 and 1100° C. by the flash lamps 69.

After a lapse of about ten seconds after the flash heating step is completed, the susceptor 73 and heating plate 74 are driven by the motor 40 to move downwardly to the transporting position of the semiconductor wafer W shown in FIG. 1 while the opening 66 closed by the gate valve 68 is opened (step S17). As the susceptor 73 and heating plate 74 move downwardly, the semiconductor wafer W is transferred to the support pins 70. Then, the semiconductor wafer W mounted on the support pins 70 is transported out of the chamber 65 by the transport robot not shown (step S18). As described, a series of heat treatment operation is completed.

When heating the semiconductor wafer W by lighting up the flash lamps 69, instantaneous flashlight irradiation causes rapid thermal expansion of the wafer surface, so that the semiconductor wafer W is going to warp to be convex. At this time, the semiconductor wafer W may break due to stress generated at a contact part, if any, between an end of the semiconductor wafer W and a positioning pin or the like at the time of instantaneous thermal expansion, as already described.

In the present embodiment, flash heating is performed after a lapse of sixty-one seconds after the semiconductor wafer W is mounted on the upper surface of the susceptor 73, i.e., while the semiconductor wafer W is floating with a gas layer sandwiched between the upper surface of the susceptor 73 and the semiconductor wafer W. Therefore, at the time of flashlight irradiation, there is no frictional force between the semiconductor wafer W and susceptor 73, so that the semiconductor wafer W can freely move. As a result, even when instantaneous flashlight irradiation causes rapid thermal expansion of the wafer surface, the semiconductor wafer W does not suffer a great stress, which can prevent the semiconductor wafer W from breaking at the time of flashlight irradiation.

Second Preferred Embodiment

Next, a second preferred embodiment of the present invention will be described. A heat treatment apparatus according to the present embodiment has exactly the same structure as that of the first preferred embodiment, explanation of which is thus omitted here. The present embodiment differs from the first preferred embodiment only in the procedure of heat treatment operation performed on the semiconductor wafer W.

Figure 6:
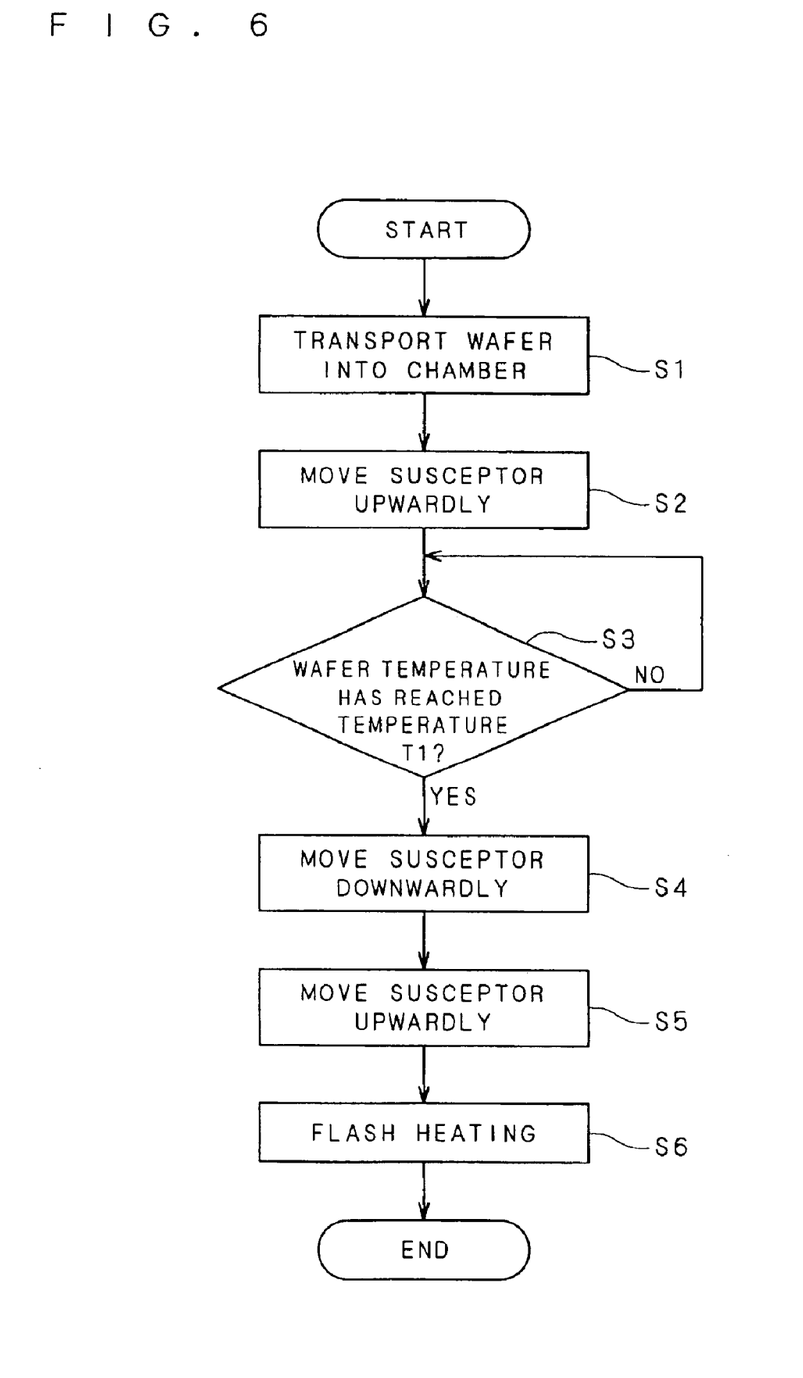
FIG. 6 is a flow chart illustrating the procedure of heat treatment performed by a heat treatment apparatus according to a second preferred embodiment of the invention.

FIG. 6 is a flow chart illustrating the procedure of heat treatment operation according to the second preferred embodiment. In the present embodiment, the semiconductor wafer W is transported into the chamber 65 by a transport robot not shown through the opening 66 and is mounted on the support pins 70 while the susceptor 73 and heating plate 74 are located at the transporting position of the semiconductor wafer W shown in FIG. 1 (step S1). Upon completion of transport of the semiconductor wafer W, the opening 66 is closed by the gate valve 68. Thereafter, the susceptor 73 and heating plate 74 are driven by the motor 40 to move upwardly to the heating position of the semiconductor wafer W shown in FIG. 2, for holding the semiconductor wafer W horizontally (step S2). The open/close valves 80 and 81 are opened to produce a current of nitrogen gas in the chamber 65.

The susceptor 73 and heating plate 74 are previously heated to a predetermined temperature by the action of a heater incorporated in the heating plate 74. Therefore, the semiconductor wafer W comes into contact with the susceptor 73 as heated and is thus preheated in the state where the susceptor 73 and heating plate 74 is located at the heating position of the semiconductor wafer W. The temperature of the semiconductor wafer W is therefore increasingly raised.

In this state, the semiconductor wafer W is continuously heated by the susceptor 73. During the temperature rise of the semiconductor wafer W, a temperature sensor not shown always monitors whether or not the surface temperature of the semiconductor wafer W reaches the preheated temperature T1 (step S3). The preheated temperature T1 ranges from, for example, about 200 to 600° C., as in the first preferred embodiment.

After a while, when the surface temperature of the semiconductor wafer W reaches the preheated temperature T1, the processing progresses to step S4, in which the controller 10 drives the motor 40 to temporarily move the susceptor 73 and heating plate 74 downwardly so that the semiconductor wafer W held by the susceptor 73 is transferred to the support pins 70. That is, the semiconductor wafer W held by the susceptor 73 is caused to be lifted over the upper surface of the susceptor 73 before a flashlight is irradiated from the light source 5. At this time, the susceptor 73 and heating plate 74 are not required to move downwardly to the transporting position of the semiconductor wafer W shown in FIG. 1, but only need to move downwardly to such a position that the semiconductor wafer W is lifted 1–2 mm over the upper surface of the susceptor 73.

Thereafter, the processing progresses immediately to step S5, in which the susceptor 73 and heating plate 74 are driven by the motor 40 to move upwardly again so that the semiconductor wafer W mounted on the support pins 70 is transferred to the susceptor 73. At this time, as described above, just after the semiconductor wafer W is transferred from the support pins 70 to the susceptor 73, the semiconductor wafer W floats over the upper surface of the susceptor 73 with a gas layer sandwiched between the upper surface of the susceptor 73 and the lower surface of the semiconductor wafer W.

Then, the flash lamps 69 are lit up to perform flash heating while the semiconductor wafer W is floating over the upper surface of the susceptor 73 (step S6). A period of time during which the flash lamps 69 are lit up in the flash heating step ranges between about 0.1 and 10 milliseconds.

With such flash heating, the surface temperature of the semiconductor wafer W instantaneously reaches the temperature T2. This temperature T2 ranges between about 1000 and 1100° C. which is necessary for ion activation in the semiconductor wafer W. Rising the surface temperature of the semiconductor wafer W to such temperature T2 enables activation of ions implanted into the semiconductor wafer W.

Upon completion of the flash heating step, the susceptor 73 and heating plate 74 are driven by the motor 40 to move downwardly to the transporting position of the semiconductor wafer W shown in FIG. 1 while the opening 66 closed by the gate valve 68 is opened. As the susceptor 73 and heating plate 74 move downwardly, the semiconductor wafer W is transferred from the susceptor 73 to the support pins 70. Then, the semiconductor wafer W mounted on the support pins 70 is transported out of the chamber 65 by the transport robot not shown. As described, the heat treatment operation according to the second preferred embodiment is completed.

In the present embodiment, the susceptor 73 is moved downwardly just before (about a second before) a flashlight is irradiated from the light source 5 to cause the top ends of the support pins 70 to extend out of the upper surface of the susceptor 73, so that the semiconductor wafer W held by the susceptor 73 is temporarily lifted over the upper surface of the susceptor 73. Then, when a flashlight is irradiated from the light source 5, the susceptor 73 is moved upwardly again to cause the top ends of the support pins 70 to be located under the upper surface of the susceptor 73, and a gas layer is sandwiched between the upper surface of the susceptor 73 and the lower surface of the semiconductor wafer W to ensure that the semiconductor wafer W floats over the upper surface of the susceptor 73.

Therefore, at the time of flashlight irradiation, there is no frictional force between the semiconductor wafer W and susceptor 73, so that the semiconductor wafer W can freely move. As a result, even when instantaneous flashlight irradiation causes rapid thermal expansion of the wafer surface, the semiconductor wafer W does not suffer a great stress, which can prevent the semiconductor wafer W from breaking at the time of flashlight irradiation. However, if the semiconductor wafer W is kept away from the susceptor 73 for a long time, the surface temperature of the semiconductor wafer W decreases from the preheated temperature T1. Therefore, the controller 10 is required to control the motor 40 such that the susceptor 73 moves upwardly again immediately after moving downwardly.

Third Preferred Embodiment

Figure 7:
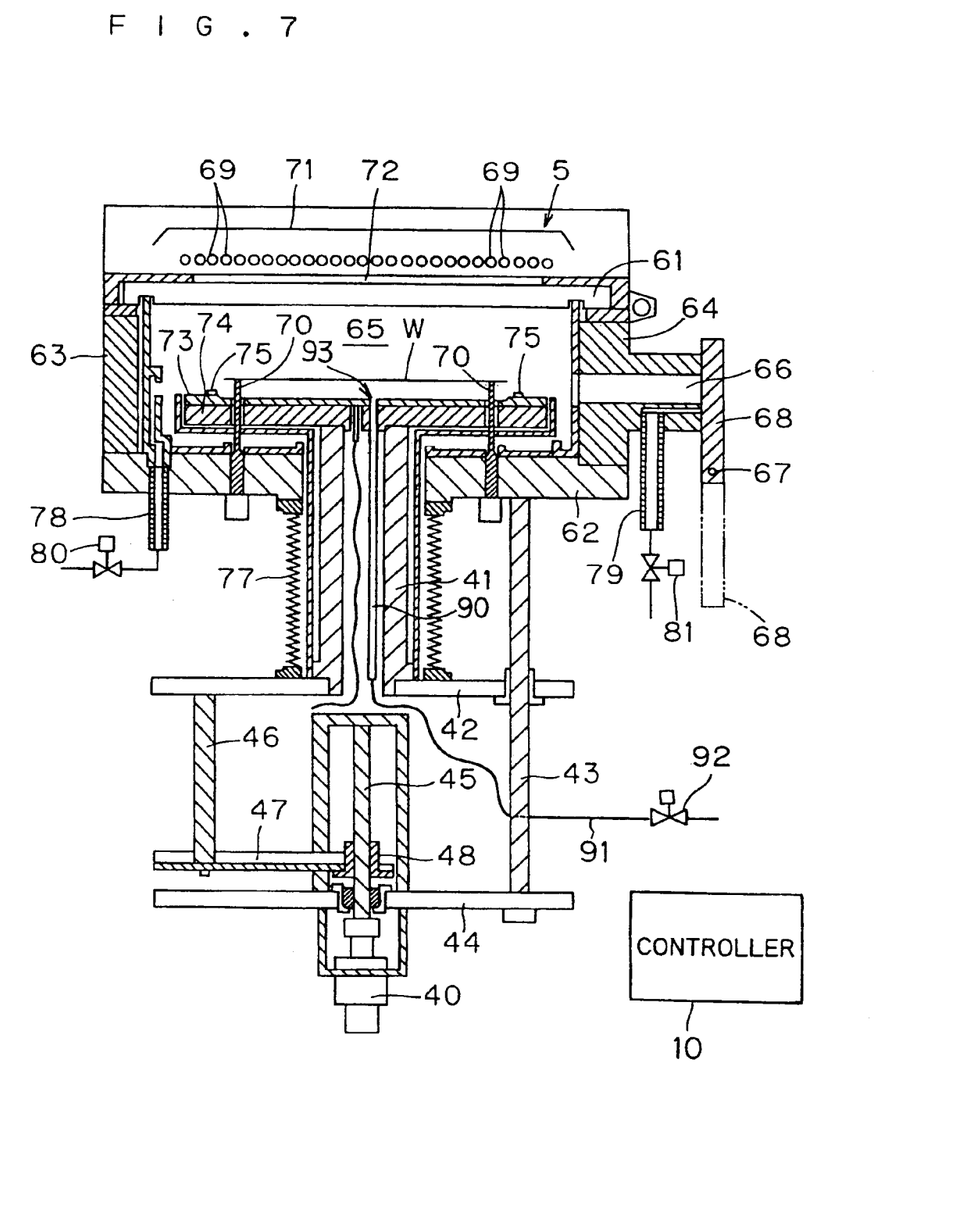
FIG. 7 is a sectional side elevation illustrating the structure of a heat treatment apparatus according to a third preferred embodiment of the invention.

Next, a third preferred embodiment of the present invention will be described. A heat treatment apparatus according to the present embodiment has the same structure as that of the first preferred embodiment except for an additional mechanism for discharging nitrogen gas from the upper surface of the susceptor 73 toward the lower surface of the semiconductor wafer W. FIG. 7 is a sectional side elevation illustrating the structure of the heat treatment apparatus according to the third preferred embodiment.

In the heat treatment apparatus of the present embodiment, a gas supply pipe 90 is provided in the susceptor 73 and heating plate 74 so as to hang down therefrom. The gas supply pipe 90 has its top end inserted into the susceptor 73 and heating plate 74 to form a discharge port 93 on the upper surface of the susceptor 73. The discharge port 93 is directed toward the lower surface of the semiconductor wafer W.

The gas supply pipe 90 has its base end communicating with a gas pipe 91. The gas pipe 91 is connected to a nitrogen gas supply source not shown, and an open/close valve 92 is provided on a path therebetween. Since the gas supply pipe 90 moves upwardly/downwardly as the susceptor 73 and heating plate 74 move upwardly/downwardly, the gas pipe 91 and gas supply pipe 90 are connected by a flexible tube or the like.

Opening the open/close valve 92 allows nitrogen gas to be discharged from the discharge port 93 toward the lower surface of the semiconductor wafer W held by the susceptor 73. Opening/closing of the open/close valve 92 is also controlled by the controller 10.

The rest of the components except those described above are the same as in the first preferred embodiment, and are indicated by the same reference numerals of FIG. 1, detailed explanation of which is thus omitted here. The heat treatment operation performed on the semiconductor wafer W by the heat treatment apparatus of the present embodiment is generally the same as in the second preferred embodiment (FIG. 6) except the method of lifting the semiconductor wafer W.

That is, the support pins 70 are caused to extend out of the upper surface of the susceptor 73 in the step S4 shown in FIG. 6, thereby causing the semiconductor wafer W held by the susceptor 73 to be lifted over the upper surface of the susceptor 73 in the second preferred embodiment, however, nitrogen gas is discharged from the discharge port 93 toward the lower surface of the semiconductor wafer W held by the susceptor 73 just before (about a second before) a flashlight is irradiated from the light source 5 so that the semiconductor wafer W held by the susceptor 73 is temporarily lifted over the upper surface of the susceptor 73. Then, the nitrogen gas discharge from the discharge port 93 is stopped when a flashlight is irradiated from the light source 5, and a gas layer is sandwiched between the upper surface of the susceptor 73 and the lower surface of the semiconductor wafer W to ensure that the semiconductor wafer W floats over the upper surface of the susceptor 73.

Therefore, similarly to the second preferred embodiment, there is no frictional force between the semiconductor wafer W and susceptor 73 at the time of flashlight irradiation, so that the semiconductor wafer W can freely move. As a result, even when instantaneous flashlight irradiation causes rapid thermal expansion of the wafer surface, the semiconductor wafer W does not suffer a great stress, which can prevent the semiconductor wafer W from breaking at the time of flashlight irradiation. However, if the semiconductor wafer W is kept away from the susceptor 73 for a long time, the surface temperature of the semiconductor wafer W decreases from the preheated temperature T1. Therefore, the controller 10 is required to control the open/close valve 92 such that the nitrogen gas discharge is stopped immediately after the semiconductor wafer W is caused to be lifted.

Modification

Although the preferred embodiments of the present invention have been described above, the present invention is not limited to the above examples. For instance, the light source 5 is provided with twenty-seven flash lamps 69 in the respective preferred embodiments, however, the number of flash lamps 69 is not limited as such but may be determined arbitrarily.

In the above preferred embodiments, the support pins 70 are provided securely while the susceptor 73 and heating plate 74 move upwardly/downwardly so that the semiconductor wafer W is transferred between the support pins 70 and susceptor 73 and heating plate 74, however, the support pins 70 may be moved upwardly/downwardly with respect to the susceptor 73 and heating plate 74 so that the semiconductor wafer W is transferred therebetween. Specifically, the support pins 70 are not fixed to the bottom plate 62, but is made movable up and down by an elevating mechanism such as an air cylinder. The susceptor 73 and heating plate 74 are provided securely. With such structure, a gas layer is also sandwiched between the upper surface of the susceptor 73 and the lower surface of the semiconductor wafer W to bring the semiconductor wafer W into a floating state over the upper surface of the susceptor 73 for about seventy seconds after the support pins 70 move downwardly and the semiconductor wafer W is mounted on the upper surface of the susceptor 73. In other words, the susceptor 73 and support pins 70 may be moved upwardly/downwardly relatively to each other.

The first preferred embodiment has described that flash heating is carried out sixty-one seconds after the semiconductor wafer W is mounted on the susceptor 73, however, this is not restrictive, but flash heating may be carried out within seventy seconds after the semiconductor wafer W is mounted on the upper surface of the susceptor 73. During about seventy seconds after the semiconductor wafer W is mounted on the upper surface of the susceptor 73, the semiconductor wafer W is in a floating state over the upper surface of the susceptor 73. Therefore, carrying out flash heating during that period can prevent the semiconductor wafer W from breaking at the time of flashlight irradiation. However, when the susceptor 73 has a thickness of, e.g., 5 mm, it is preferable that flash heating should be performed after a lapse of forty seconds or more after the semiconductor wafer W is mounted on the upper surface of the susceptor 73. This is because it requires about thirty-five seconds for the semiconductor wafer W to be heated to the preheated temperature T1 after being mounted on the upper surface of the susceptor 73.

Although the third preferred embodiment has described that nitrogen gas is discharged toward the lower surface of the semiconductor wafer W to cause the semiconductor wafer W to be lifted, another gas (e.g., air) may be used instead of nitrogen gas to cause the semiconductor wafer W to be lifted. However, it is preferable to use inert and clean nitrogen gas since it is blown onto the semiconductor wafer W heated to the preheated temperature T1.

In the third preferred embodiment, nitrogen gas may be discharged from a plurality of positions. For instance, a plurality of support pins 70 may each be provided with a through hole, from which nitrogen gas is discharged.

Further, the above preferred embodiments have described that ion activation is achieved by irradiating light onto the semiconductor wafer W, however, a substrate to be treated by the heat treatment apparatus according to the present invention is not limited to a semiconductor wafer. For instance, a glass substrate on which various silicon films such as a silicon nitride film and a polycrystalline silicon film are formed may be subjected to the treatment performed by the heat treatment apparatus according to the present invention.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for heating a substrate by irradiating the substrate with flashlight, comprising:
   a light source having a flash lamp to generate said flashlight;
   a chamber provided under said light source;
   a susceptor having a receiving surface for holding a substrate in a substantially horizontal position in said chamber;
   a lifting mechanism operable for actively lifting said substrate held by said susceptor from said receiving surface of said susceptor; and
   a lift control that controls said lifting mechanism to operate said lifting mechanism before the irradiation of flashlight from said light source to lift said substrate held by said susceptor from said receiving surface and to stop the operation of said lifting mechanism as irradiation of flashlight from said light source irradiates said substrate, so that said substrate floats toward said receiving surface supported solely by a gas layer sandwiched between said receiving surface of said susceptor and said substrate.

2. The heat treatment apparatus according to claim 1, wherein
   said lifting mechanism includes:
   support pins insertable into said susceptor and capable of mounting thereon a substrate with top ends thereof extending out of said receiving surface of said susceptor; and
   an elevating mechanism for moving said support pins upwardly/downwardly relatively to said susceptor between a position where said top ends of said support pins are located under said receiving surface of said susceptor and a position where said top ends of said support pins extend out of said receiving surface of said susceptor to support said substrate held by said susceptor, wherein
   said lift control controls said elevating mechanism to cause said support pins to extend out of said receiving surface of said susceptor before irradiation of a flashlight from said light source to lift up said substrate held by said susceptor from said receiving surface of said susceptor as well as to move said support pins downwardly to a position under said receiving surface of said susceptor at irradiation of flashlight from said light source to cause only the gas layer to be sandwiched between said receiving surface of said susceptor and said substrate for bringing said substrate into a floating state.

3. The heat treatment apparatus according to claim 1, wherein
   said lifting mechanism includes a gas discharging mechanism for discharging gas from said receiving surface of said susceptor toward a lower surface of said substrate held by said susceptor, and
   said lift control controls said gas discharging mechanism to cause said gas discharge mechanism to discharge gas toward said lower surface of said substrate held by said susceptor before irradiation of a flashlight from said light source to cause said substrate held by said susceptor to be lifted over said receiving surface of said susceptor as well as to cause said gas discharge mechanism to stop discharging gas at irradiation of the flashlight from said light source to cause only the gas layer to be sandwiched between said receiving surface of said susceptor and said substrate for bringing said substrate into a floating state.

4. The heat treatment apparatus according to claim 1, further comprising a preheating mechanism for preheating said substrate held by said susceptor before irradiation of a flashlight from said light source, wherein
   said lift control operates said lifting mechanism after the temperature of said substrate held by said susceptor reaches a predetermined preheated temperature.

5. A heat treatment method of heating a substrate by irradiating the substrate with flashlight, comprising the steps of:
   a) holding a substrate on a receiving surface of a susceptor in a substantially horizontal position;
   b) operating a lifting mechanism to lift said substrate held by said susceptor from said receiving surface of said susceptor;
   c) causing said lifting mechanism to stop operating leaving only a gas layer sandwiched between said receiving surface of said susceptor and said substrate for bringing said substrate into a floating state; and
   d) causing a flash lamp to irradiate a flashlight toward said substrate while in a floating state and after stopping the operation of said lifting mechanism.

6. The heat treatment method according to claim 5, wherein
   said step b) includes the step of causing support pins insertable into said susceptor to extend out of said receiving surface of said susceptor to lift said substrate held by said susceptor from said receiving surface of said susceptor, and
   said step c) includes the step of moving said support pins downwardly to a position under said receiving surface of said susceptor to cause only a gas layer to be sandwiched between said receiving surface of said susceptor and said substrate for bringing said substrate into a floating state.

7. The heat treatment method according to claim 5, wherein
   said step b) includes the step of discharging gas from said receiving surface of said susceptor toward a lower surface of said substrate held by said susceptor to lift said substrate held by said susceptor from said receiving surface, and
   said step c) includes the step of stopping discharge of said gas to cause only a gas layer to be sandwiched between said receiving surface of said susceptor and said substrate for bringing said substrate into a floating state.

8. The heat treatment method according to claim 5, further comprising the step of
   e) preheating said substrate held by said susceptor before irradiation of flashlight from said light source, wherein
   said step b) is executed after the temperature of said substrate held by said susceptor reaches a predetermined preheated temperature.

9. A heat treatment method of heating a substrate by irradiating the substrate with flashlight, comprising the steps of:
   a) holding a substrate over a susceptor in a substantially horizontal position;
   b) moving said susceptor and said substrate upwardly/downwardly relatively to each other to mount said substrate on a receiving surface of said susceptor; and c) causing a flash lamp to irradiate flashlight toward said substrate while said substrate passively floats solely on a gas layer sandwiched between said receiving surface of said susceptor and said substrate after said substrate is mounted on said receiving surface of said susceptor.

10. The heating method according to claim 9, wherein
said flash lamp irradiates the flashlight toward said substrate within seventy seconds after said substrate is mounted on said receiving surface of said susceptor.

11. A heat treatment apparatus for heating a substrate by irradiating the substrate with flashlight, comprising:
a light source having a flash lamp;
a chamber provided under said light source;
a susceptor having a receiving surface for holding a substrate in a substantially horizontal position in said chamber;
support pins insertable into said susceptor and capable of mounting thereon said substrate with top ends thereof extending out of said receiving surface of said susceptor;
an elevating mechanism for moving said support pins upwardly/downwardly relatively to said susceptor between a position where top ends of said support pins are located under said receiving surface of said susceptor and a position where said top ends of said support pins extend out of said receiving surface of said susceptor to support said substrate held by said susceptor; and
an irradiation control element for controlling said light source to cause said flash lamp to irradiate flashlight toward said substrate while said substrate is passively floating with only a gas layer sandwiched between said receiving surface of said susceptor and said substrate after said elevating mechanism moves said susceptor and said substrate mounted on said support pins upwardly/downwardly relatively to each other to mount said substrate on said receiving surface of said susceptor.

12. The heat treatment apparatus according to claim 11, wherein
said irradiation control element controls said light source to cause said flash lamp to irradiate a flashlight toward said substrate within seventy seconds after said substrate is mounted on said receiving surface of said susceptor.

* * * * *